(12) United States Patent
Ueda et al.

(10) Patent No.: US 9,810,747 B2
(45) Date of Patent: Nov. 7, 2017

(54) MAGNETIC SENSOR AND MAGNETIC ENCODER

(71) Applicant: TDK Corporation, Tokyo (JP)

(72) Inventors: Kunihiro Ueda, Tokyo (JP); Yoshiyuki Mizoguchi, Tokyo (JP); Hiroshi Yamazaki, Tokyo (JP); Suguru Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 42 days.

(21) Appl. No.: 14/996,536

(22) Filed: Jan. 15, 2016

(65) Prior Publication Data

US 2016/0282145 A1    Sep. 29, 2016

(30) Foreign Application Priority Data

Mar. 27, 2015   (JP) .................................. 2010-67499

(51) Int. Cl.
  *G01B 7/14*   (2006.01)
  *G01R 33/09*  (2006.01)
  (Continued)

(52) U.S. Cl.
  CPC .......... *G01R 33/09* (2013.01); *G01R 33/0052* (2013.01); *G01R 33/093* (2013.01);
  (Continued)

(58) Field of Classification Search
  CPC ....... H01L 21/00; H01L 2221/00; G01R 1/00; G11B 3/00; G11B 2209/00; G01D 1/00
  See application file for complete search history.

(56) References Cited

U.S. PATENT DOCUMENTS 4,503,394 A * 3/1985 Kawakami ............. G01R 33/09
                                              257/E43.001
5,521,501 A * 5/1996 Dettmann ............. G01R 33/096
                                              324/207.12
(Continued)

FOREIGN PATENT DOCUMENTS

JP  2001-264112 A  9/2001
JP  2009-036770 A  2/2009
(Continued)

OTHER PUBLICATIONS

Office Action dated Feb. 7, 2017 issued in corresponding JP patent application No. 2015-067499.

*Primary Examiner* — Jermele M Hollington
*Assistant Examiner* — Temilade Rhodes-Vivour
(74) *Attorney, Agent, or Firm* — Posz Law Group, PLC

(57) ABSTRACT

A magnetic sensor is provided with first and second magnetoresistive effect elements that can detect an external magnetic field. The first and second magnetoresistive effect elements include at least magnetization direction change layers where a direction of magnetization is changed according to an external magnetic field. The width W1 of a magnetization direction change layer in an initial magnetization direction of the magnetization direction change layer of the first magnetoresistive effect element, and the width W2 of a magnetization direction change layer in an initial magnetization direction of the magnetization direction change layer of the second magnetoresistive effect element have a relationship shown by formula (1) below. Sensitivity of the first magnetoresistive effect element to the external magnetic field is higher than that of the second magnetoresistive effect element.

$$W1 > W2 \quad (1)$$

12 Claims, 7 Drawing Sheets

(51) Int. Cl.
    *G01R 33/00*     (2006.01)
    *H01L 21/00*     (2006.01)
    *G01R 1/00*     (2006.01)

(52) U.S. Cl.
    CPC ............... *G01R 1/00* (2013.01); *H01L 21/00* (2013.01); *H01L 2221/00* (2013.01)

(56) References Cited

U.S. PATENT DOCUMENTS

| | | | | |
|---|---|---|---|---|
| 6,329,818 B1* | 12/2001 | Tokunaga | ............... | B82Y 25/00 324/252 |
| 2010/0259257 A1* | 10/2010 | Sasaki | ................... | B82Y 25/00 324/252 |
| 2011/0069417 A1* | 3/2011 | Kawamori | ............. | B82Y 10/00 360/319 |
| 2011/0216432 A1* | 9/2011 | Yanagisawa | ........... | G11B 20/10 360/39 |

FOREIGN PATENT DOCUMENTS

| | | |
|---|---|---|
| JP | 2013-160639 A | 8/2013 |
| JP | 2013-229444 A | 11/2013 |
| JP | 2014-006126 A | 1/2014 |
| WO | 2009/084435 A1 | 7/2009 |

\* cited by examiner

MAGNETIC SENSOR AND MAGNETIC ENCODER

CROSS-REFERENCE TO RELATED APPLICATION

This application is based on Japanese Patent Application No. 2015-67499 filed on Mar. 27, 2015, the disclosure of which is incorporated herein by reference.

TECHNICAL FIELD

The present application relates to a magnetic sensor, and a magnetic encoder equipped with the magnetic sensor.

BACKGROUND

Conventionally, in machine tools or the like, a position detecting device for detecting a position created by the rotational movement or linear movement of a movable body is used. One type of known position detecting device is provided with a medium/media where magnetic signals are recorded and a magnetic sensor, where the magnetic sensor can output a signal indicating a relative positional relationship between a medium and the magnetic sensor.

One known magnetic sensor used in such a position detecting device is a multilayer body having a free layer and a magnetization pinned layer, and being provided with a magnetoresistive effect element (MR element) where resistance is changed relative to the magnetization direction of the free layer according to an external magnetic field. Further, known media used in such a position detecting device include, for example, one having a track for absolute signals, one having a track for incremental signals, and one having a track for absolute signals and a track for incremental signals.

Conventionally, a magnetic sensor that is used for the position detecting device equipped with a medium having a track for absolute signals and a track for incremental signals has two types of MR elements: an MR element for detecting a magnetic signal recorded in the track for absolute signals, and an MR element for detecting a magnetic signal recorded in the track for incremental signals (see Patent Literature 1).

PATENT LITERATURE

Japanese Patent Application Laid-Open No. 2001-264112

In the magnetic sensor, the MR element for detecting a magnetic signal recorded in the track for absolute signals requires a characteristic (response characteristic) to exponentially change an output in response to the change in the magnetic field relative to the movement of the medium. In the meantime, the MR element for detecting a magnetic signal recorded in the track for incremental signals requires a characteristic (response characteristic) to linearly change the output in response to the change in the magnetic field accompanying the relative movement of the medium.

Thus, in two types of in-demand MR elements having different response characteristics, recently, there is a demand for improvement of the response characteristics, such as increased sensitivity or lower noise. Conventionally, improvements in the response characteristics are achieved by using materials configuring layers, such as the free layer configuring the MR elements, and by optimizing film thickness of the layers and the like. However, there is the problem that it is very difficult to further improve the response characteristics by these means.

SUMMARY

Reflecting on the above problem, the objective of the present embodiment is to produce a magnetic sensor and a magnetic encoder that have two types of magnetoresistive effect elements requiring mutually different responsive characteristics, and that can improve different response characteristics required for the magnetoresistive effect elements.

In order to solve the problem above, the present embodiment provides a magnetic sensor that is provided with at least a first magnetoresistive effect element and a second magnetoresistive effect element that can detect an external magnetic field, wherein: the first magnetoresistive effect element and the second magnetoresistive effect element each include at least a magnetization direction change layer where a direction of magnetization is changed according to the external magnetic field; width W1 of the magnetization direction change layer in an initial magnetization direction of magnetization direction change layer of the first magnetoresistive effect element, and width W2 of the magnetization direction change layer in an initial magnetization direction of magnetization direction change layer of the second magnetoresistive effect element have a relationship shown by the formula (1) below; and sensitivity of the first magnetoresistive effect element to the external magnetic field is higher than that of the second magnetoresistive effect element to the external magnetic field $$W1 > W2 \qquad (1)$$

According to the embodiment, the width W1 in the initial direction of the magnetization direction change layer of the first magnetoresistive effect element, which is required to be an exponential slope of the output (a change of output is exponential), is greater than the W2 in the initial direction of the magnetization direction change layer of the second magnetoresistive effect element, which is required to be a linear slope of the output (a change of output is linear). Because the sensitivity of the first magnetoresistive effect element is higher than that of the second magnetoresistive effect element, the different responsive characteristics required of the first and the second magnetoresistive effective elements can be both improved.

In the embodiment above, it is preferable that a ratio W1/L1 of the width W1 of the magnetization direction change layer of the first magnetoresistive effect element to length L1 in a direction that is orthogonal to the width W1 and a ratio W2/L2 of the width W2 of the magnetization direction change layer of the second magnetoresistive effect element to the length L2 in a direction that is orthogonal to the width W2, are both 1.2 or less.

In the embodiment above, it is preferable that a ratio W1/L1 of the width W1 of the magnetization direction change layer of the first magnetoresistive effect element to the length L1 in the direction that is orthogonal to the width W1, and a ratio W2/L2 of the width W2 of the magnetization direction change layer of the second magnetoresistive effect element to the length L2 in the direction that is orthogonal to the width W2, W2/L2 have a relationship shown with the formula (2) below.

$$W1/L1 \geq W2/L2 \qquad (2)$$

In the embodiments above, it is preferable that a ratio of the width W1 of the magnetization direction change layer of the first magnetoresistive effect element to the width W2 of the magnetization direction change layer of the second magnetoresistive effect element be 1:0.2 to 0.9.

Further, the present embodiment provides a magnetic sensor that is provided with at least a first magnetoresistive effect element and a second magnetoresistive effect element that can detect an external magnetic field, wherein the first magnetoresistive effect element and the second magnetoresistive effect element each include at least a magnetization direction change layer where a direction of magnetization is changed according to the external magnetic field, respectively; width W1 of the magnetization direction change layer in an initial magnetization direction of magnetization direction change layer of the first magnetoresistive effect element and length L1 in a direction that is orthogonal to the width W1, and width W2 of the magnetization direction change layer in an initial magnetization direction of magnetization direction change layer of the second magnetoresistive effect element and length L2 in a direction that is orthogonal to the width W2 have relationships shown by formulas (3) and (4) below.

$$W1=W2 \quad (3)$$

$$W1/L1>W2/L2 \quad (4)$$

According to the embodiment above, even if the width W1 in the initial magnetization direction of the magnetization direction change layer of the first magnetoresistive effect element, which is required to be an exponential slope of an output (output change is exponential) and the width W2 in the initial magnetization direction of the magnetization direction change layer of the second magnetoresistive effect element, which is required to be a linear slope of an output (output change is linear) are the same, because the ratio of the width W1 to the length L1 in the orthogonal direction of the width W1 (aspect ratio) is greater than the ratio of the width W2 to the length L2 in the orthogonal direction of the width W2 (aspect ratio), the different responsive characteristics that are required of the first and the second magnetoresistive effect elements can be improved, respectively.

In the embodiments above, it is preferable that a ratio of the width W1 of the magnetization direction change layer in an initial magnetization direction of the magnetization direction change layer of the first magnetoresistive effect element to the length L1 in a direction that is orthogonal to the width W1 is 0.8 or greater.

In the embodiments above, when the first magnetoresistive effect element and the second magnetoresistive effect element are viewed from the upper side of in the lamination direction, it is preferable that shape of the magnetization direction change layer of the first magnetoresistive effect element and shape of the magnetization direction change layer of the second magnetoresistive effect element are the same type.

In the embodiments above, as the first magnetoresistive effect element and the second magnetoresistive effect element, a TMR element, a GMR element or an AMR element can be used.

In the embodiments above, it is preferable that the first magnetoresistive effect element and the second magnetoresistive effect element are formed by laminating a magnetization pinned layer, a nonmagnetic intermediate layer and the magnetization direction change layer in that order, and in such embodiment, it is preferable that the nonmagnetic intermediate layer is MgOx (X=0.1 to 0.9).

In addition, the present embodiment provides a magnetic encoder, including: the magnetic sensor according to the embodiments; and a scale part that includes an absolute signal track where absolute magnetic signals are recorded, and an incremental signal track where incremental magnetic signals are recorded, that is relatively movable relative to the magnetic sensor, wherein the magnetic sensor and the scale part are placed to face each other so as to allow the first magnetoresistive effect element and the absolute signal track to face each other, and so as to allow the second magnetoresistive effect element and the incremental signal track to face each other.

In the embodiment above, it is preferable that an initial magnetization direction of the magnetization direction change layer in the first magnetoresistive effect element and the second magnetoresistive effect element is a direction that is orthogonal to a relative movement direction of the scale part relatively moves.

According to the present embodiment, the magnetic sensor and the magnetic encoder include two types of magnetoresistive effect elements requiring mutually different responsive characteristics, and that can both improve the different responsive characteristics required for each magnetoresistive effect element can be provided.

DETAILED DESCRIPTION

Figure 1:
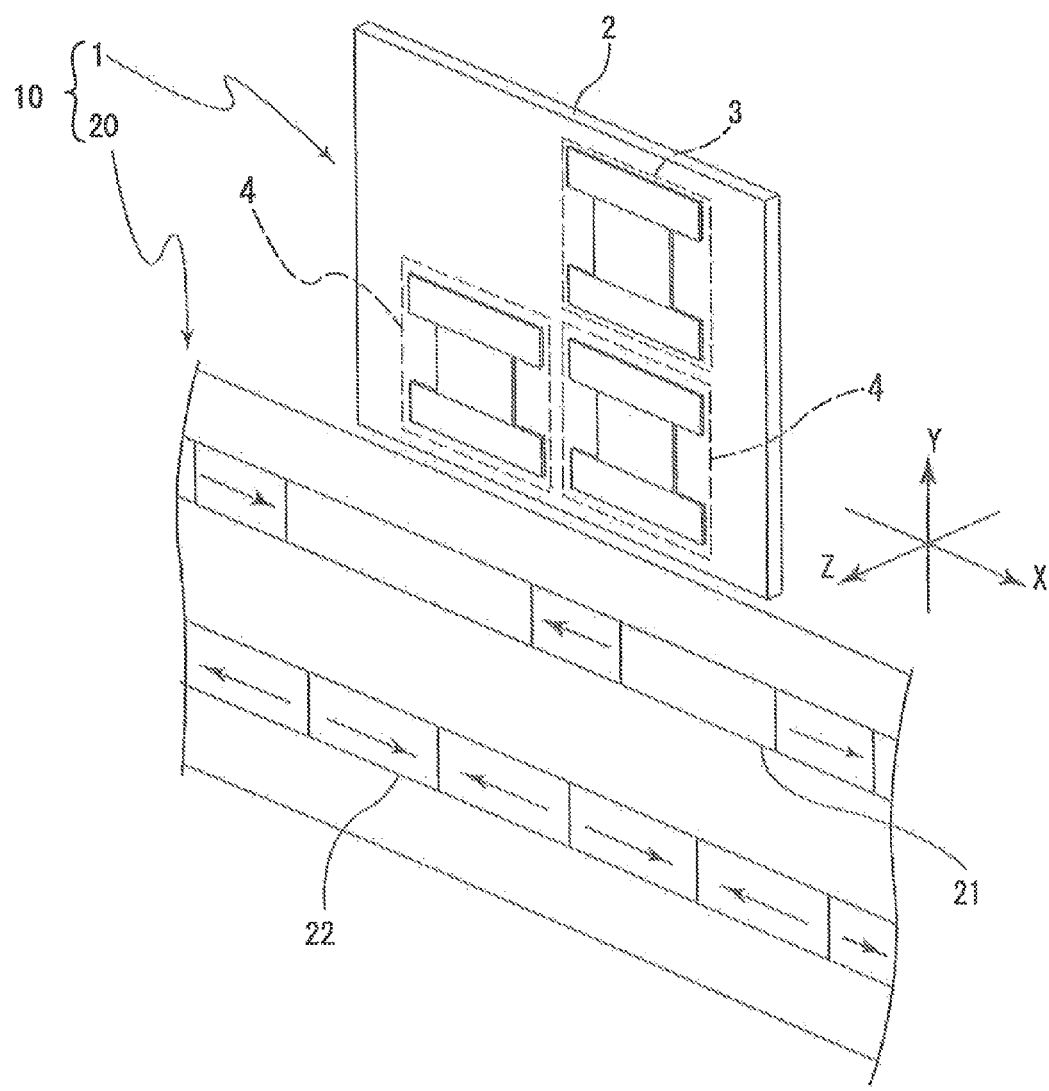
FIG. 1 is a perspective view showing a schematic configuration of a magnetic encoder that is provided with a magnetic sensor relating to an exemplary embodiment of the present embodiment.
Figure 2:
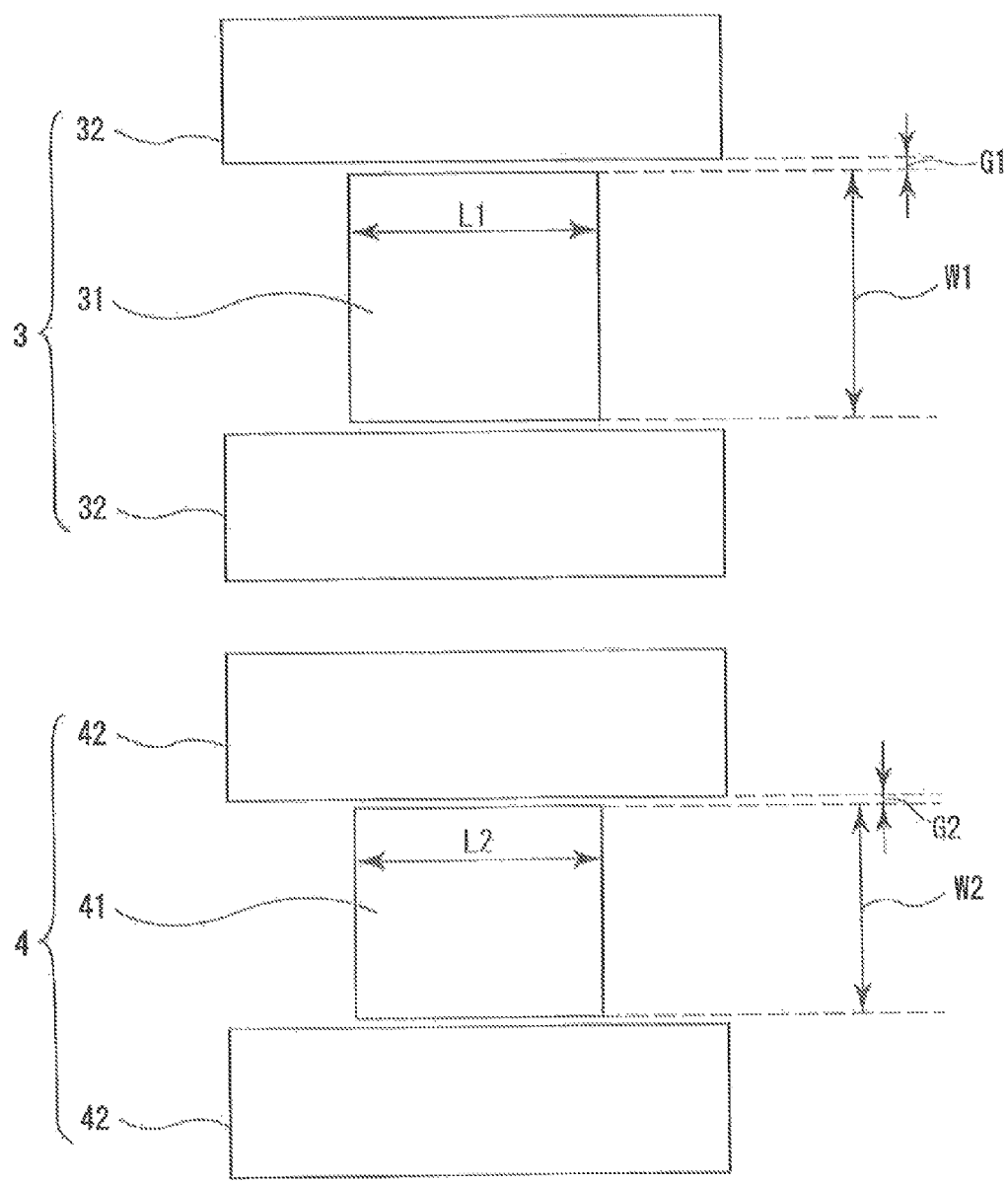
FIG. 2 is a plan view showing a schematic configuration of the magnetic sensor relating to the exemplary embodiment of the present embodiment.
Figure 3:
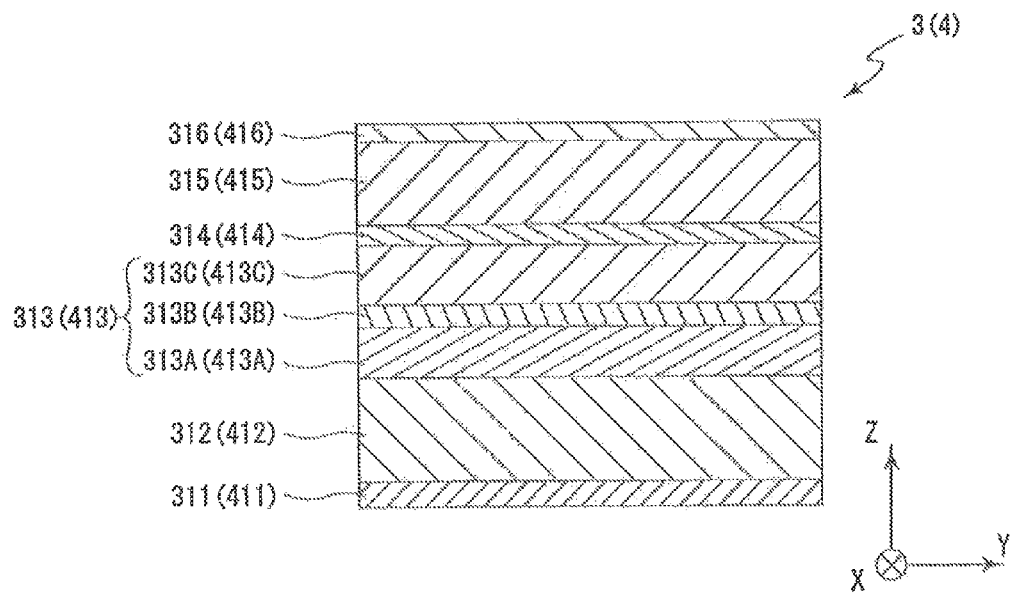
FIG. 3 is a cross-sectional view showing a schematic configuration of a first magnetoresistive effect element or a second magnetoresistive effect element in the exemplary embodiment of the present embodiment.
Figure 4:
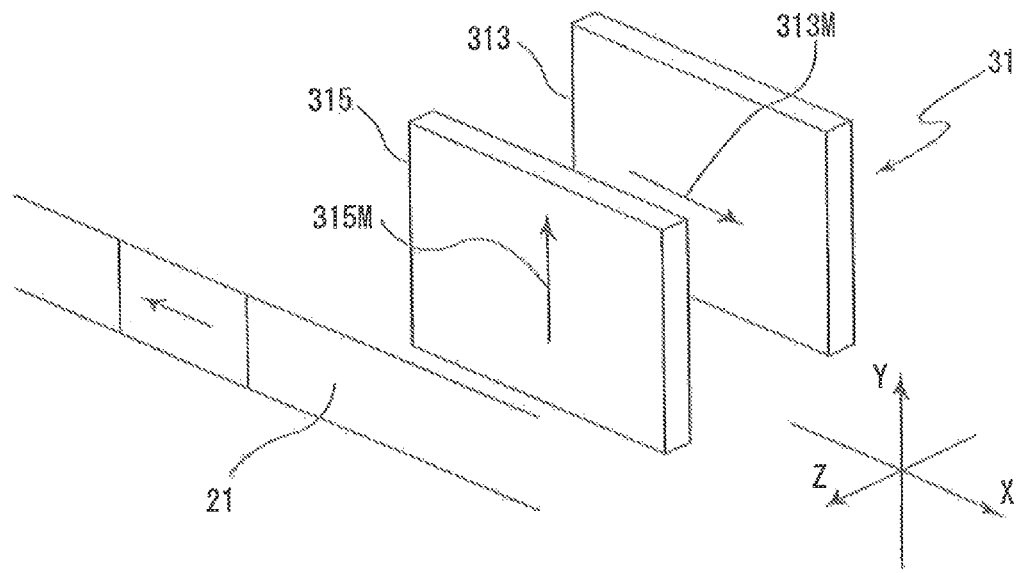
FIG. 4 is a perspective view (No. 1) for explaining operation of the first magnetoresistive effect element in the exemplary embodiment of the present embodiment.

Embodiments of the present embodiment are explained in detail with reference to the drawings. FIG. 1 is a perspective view showing the schematic configuration of a magnetic encoder provided with a magnetic sensor relating to an exemplary embodiment of the present embodiment; FIG. 2 is a plan view showing the schematic configuration of the magnetic sensor relating to the exemplary embodiment of the present embodiment; FIG. 3 is a cross sectional view showing a schematic configuration of the magnetic sensor relating to the exemplary embodiment of the present embodiment; and FIG. 4 is a perspective view of magnetoresistive effect elements in the exemplary embodiment of the present embodiment.

As shown in FIG. 1, a magnetic encoder 10 in the present embodiment is provided with a magnetic sensor 1 relating to the first embodiment and a scale part 20 that is relatively movable in a first direction (hereafter, the "X direction") to the magnetic sensor 1.

In the present embodiment, the scale part 20 is a so-called linear scale, and has an absolute signal track 21 where absolute magnetic signals are recorded, and an incremental signal track 22 where incremental magnetic signals are recorded. The absolute magnetic signals and the incremental magnetic signals are magnetized in the first direction (±X direction), respectively. Furthermore, in FIG. 1, the magnetization directions of the absolute magnetic signals and the incremental magnetic signals are shown with arrows, respectively.

[First Embodiment]

As shown in FIG. 1, the magnetic sensor 1 relating to the first embodiment is provided with a substrate 2, a first magnetic sensor part 3 and two second magnetic sensor parts 4 placed on the substrate 2. The first magnetic sensor part 3 is a magnetic sensor for detecting an absolute magnetic signal recorded in the absolute signal track 21 of the scale part 20. The second magnetic sensor part 4 is a magnetic sensor for detecting an incremental magnetic signal recorded in the incremental signal track 22 of the scale part 20.

As shown in FIG. 2, the first sensor part 3 is provided with a spin-valve type first magnetoresistive effect element (first MR element) 31, and bias magnetic field generators 32 that are placed at both sides in a second direction (hereafter, the Y direction) of the first MR element 31 so that the first MR element 31 is interposed between the bias magnetic field generators 32. The second magnetic sensor part 4 is provided with a spin-valve type second magnetoresistive effect element (second MR element) 41, and bias magnetic field generators 42 that are placed at both sides in the Y direction of the second MR element 41 so that the second MR element 41 is interposed between the bias magnetic field generators 42.

The substrate 2 is rectangular, supports both the first magnetic sensor part 3 and the second magnetic sensor parts 4 and can be made, for example, from glass, silicon (Si), aluminum oxide (Al$_2$O$_3$), AlTic (Al$_2$O$_3$—TiC) or the like.

In the first embodiment, the first MR element 31 that detects an absolute magnetic signal recorded in the absolute signal track 21 has a response characteristic that can exponentially change an output according to a change in the external magnetic field by the relative movement of the track 21 (scale part 20). In the meantime, the second MR element 41 that detects an incremental magnetic signal recorded in the incremental signal track 22 has a response characteristic that can linearly change the output according to the change in the external magnetic field due to the relative movement of the track 22 (scale part 20). In other words, a slope of the output by the first MR element 31 becomes greater than that of the output by the second MR element 41. For example, if the external magnetic field is changed within the range of −50 Oe to 50 Oe, the slope of the output by the first MR element 31 is approximately 10 mV/Oe or greater. In the meantime, the slope of the output by the second MR element 41 is approximately 2 to 5 mV/Oe. In other words, the sensitivity (mV/mT) of the first MR element 31 to the external magnetic field is higher than that of the second MR element 41. The first MR element 31 and the second MR element 41 can effectively demonstrate response characteristics that are mutually different due to a difference in dimensions (width) viewed from the upper side in the lamination direction (Z direction).

Specifically, the width W1 of the first MR element 31 in the Y direction and the width W2 of the second MR element 41 in the Y direction have the relationship shown in the formula (1) below.

$$W1 > W2 \tag{1}$$

In the first embodiment, it is preferable that the ratio of the width W1 of the first MR element 31 in the Y direction to the width W2 of the second MR element 41 in the Y direction (W1:W2) be 1:0.2 to 0.9, and it is particularly preferable that the ratio be 1:0.2 to 0.5. Because the width W1 of the first MR element 31 is greater than the width W2 of the second MR element 41, the output of the first MR element 31 can be exponentially changed, and the output of the second MR element 41 can be linearly changed.

In the first embodiment, it is preferable that the ratio of the width W1 to the length L1 of the first MR element 31 (aspect ratio, W1/L1) and the ratio of the width W2 to the length L2 of the second MR element 41 (aspect ratio, W2/L2) have the relationship shown in the formula (2) below.

$$W1/L1 \geq W2/L2 \tag{2}$$

Because the aspect ratios (W1/L1, W2/L2) of both have the relationship indicated by formula (2), the output of the first MR element 31 can be exponentially changed, and, the output of the second MR element 41 can be more linearly changed.

It is preferable that the aspect ratios (W1/L1, W2/L2) of the first MR element 31 and the second MR element 41 be 1.2 or less, and it is particularly preferable that the aspect ratio (W1/L1) of the first MR element 31 be 0.8 or greater. If the aspect ratios (W1/L1, W2/L2) exceed 1.2, stabilizing magnetization may become difficult because initial directions of magnetization direction change layers 315 and 415 (see FIG. 3) of the first MR element 31 and the second MR element 41 become the transverse directions of magnetization direction change layers 315 and 415. Further, if the aspect ratio (W1/L1) of the first MR element 31 is less than 0.8, it may become difficult to exponentially change the output of the first MR element 31.

In the first embodiment, the shape of the first MR element 31 and the shape of the second MR element 41 viewed from the upper side in the lamination direction are not particularly limited, but they can be similar shapes. Furthermore, for similar shapes in the first embodiment, for example, if the first MR element 31 and the second MR element 41 are both polygons, the number of sides is the same for both (mutually quadrangle-shaped, pentagon-shaped, hexagonally-shaped or the like).

Figure 5:
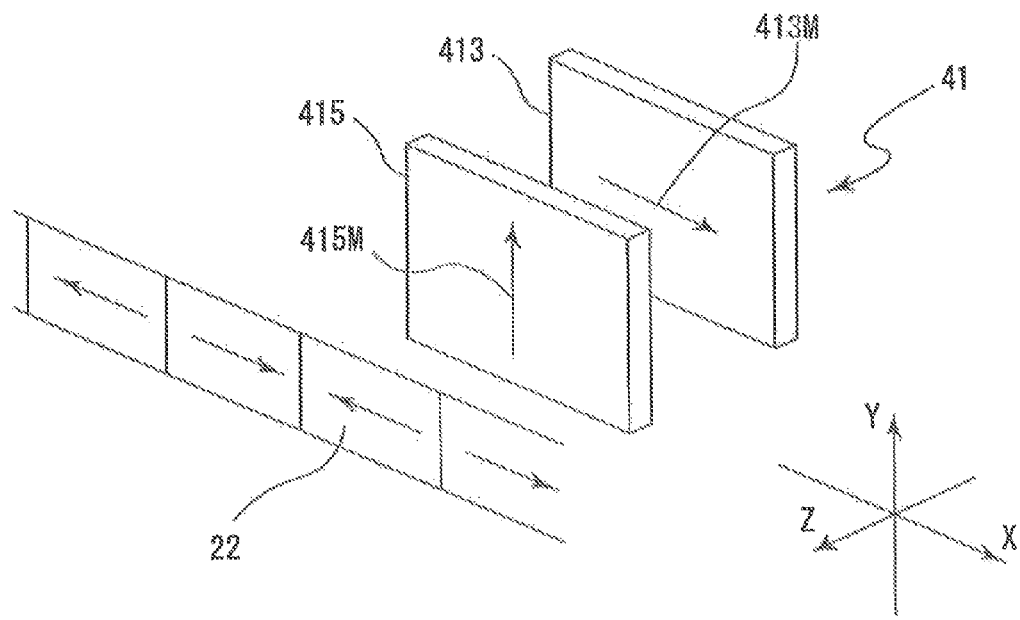
FIG. 5 is a perspective view (No. 1) for explaining operation of the second magnetoresistive effect element in the exemplary embodiment of the present embodiment.

The bias magnetic field generators 32 and 42 are configured with, for example, a permanent magnet, and a bias magnetic field is applied to the magnetization direction change layers 315 and 415 so as to orient the initial magnetization directions (magnetizations 315M and 415M of the entire magnetization direction change layers 315 and 415 when the external magnetic field is zero (zero magnetic field) (see FIGS. 4 and 5)) of the magnetization direction change layers 315 and 415 (see FIG. 3) to a predetermined direction (Y direction in the first embodiment).

The distance G1 between the first MR element 31 and the bias magnetic field generator 32 is preferably greater than the distance G2 between the second MR element 41 and the bias magnetic field generator 42, and the distance G1 is preferably approximately 1 µm to 5 µm, and more preferably approximately 1 µm to 2 µm. The distance G2 is preferably 0 to 5 µm, and is more preferably approximately 0 to 1 µm. Because the distance G1 is greater than the distance G2, the intensity of the bias magnetic field to be applied to the first MR element 31 becomes smaller than that of the bias magnetic field applied to the second MR element 41; therefore, the change of the output from the first MR element 31 can be more exponential. In the meantime, the change in the output from the second MR element 41 can be more linear. Furthermore, the distance G1 between the first MR element 31 and the bias magnetic field generator 32 is defined as the shortest distance in the Y direction between the first MR element 31 and the bias magnetic field generator 32 in a planar view of the magnetic sensor 1 (viewed from the upper side in the lamination direction of the first MR element 31). The distance G2 between the second MR element 41 and the bias magnetic field generator 42 similarly is defined as the shortest distance in the Y direction between the second MR element 41 and the bias magnetic field generator 42.

Next, the lamination structure of the first MR element 31 and the second MR element 41 is explained. As shown in FIG. 3, the first MR element 31 and the second MR element 41 are multilayer bodies where under layers 311 and 411, antiferromagnetic layers 312 and 412, magnetization pinned layers 313 and 413, nonmagnetic intermediate layers 314 and 414, magnetization direction change layers 315 and 415 and cap layers 316 and 416 are laminated in that order. A lower side electrode layer and an upper side electrode layer (both not illustrated) made from a Cu film or the like are placed under the under layers 311 and 411 and over the cap layers 315 and 416, respectively, and a sense current flows in the lamination direction of the first MR element 31 and the second MR element 41.

Under layers 311 and 411 are formed to eliminate the effect of a crystal axis of the substrate 2, and to enhance crystallizability and orientation of each layer that is laminated and formed on/over the under layers 311 and 411. For example, Ta, Ru and the like are exemplary materials to configure the under layers 311 and 411.

The antiferromagnetic layers 312 and 412 are layers that fulfill the role of pinning the magnetization direction of the magnetization pinned layers 313 and 413 over those layers. Antiferromagnetic materials containing, for example, at least one type of element selected from the group of Pt, Ru, Rh, Pd, Ni, Cu, Ir, Cr and Fe, and Mn are exemplary materials for configuring the antiferromagnetic layers 312 and 412. The content of Mn in such an antiferromagnetic material is preferably 35 to 95 atomic %.

A non-heat treatment type antiferromagnetic material that indicates antiferromagnetic properties without requiring any heat treatment, and that induces an exchange-coupling magnetic field with ferromagnetic material, and a heat treatment type antiferromagnetic material that indicates antiferromagnetic properties by a heat treatment are available as the antiferromagnetic materials. In the first embodiment, either type of antiferromagnetic material is usable as material configuring the antiferromagnetic layers 312 and 412. RuRhMn, FeMn, IrMn and the like are exemplary non-heat treatment type antiferromagnetic materials, and PtMn, NiMn, PtRhMn and the like are exemplary heat treatment type antiferromagnetic materials.

Magnetization pinned layers 313 and 413 have a configuration where first magnetization pinned layers 313A and 413A, intermediate layers 313B and 413B and second magnetization pinned layers 313C and 413C are laminated on the antiferromagnetic layers 312 and 412, in that order. NiFe, CoZrTa, sendust, NiFeCo, CoZrNb, CoFe and the like can be exemplary materials configuring the first magnetization pinned layers 313A and 413A and the second magnetization pinned layers 313C and 413C, and Ru and the like can be exemplary materials configuring the intermediate layers 313B and 413B. The thickness of the magnetization pinned layers 313 and 413 can be approximately 3.5 nm to 5.5 nm.

In the magnetization pinned layers 313 and 413, the magnetization of the first magnetization pinned layers 313A and 413A is solidly pinned by the antiferromagnetic layers 312 and 412, and the magnetization of the second magnetization pinned layers 313C and 413C is exchange-coupled with the first magnetization pinned layers 313A and 413A via the intermediate layers 313B and 413B and is solidly pinned. In the first embodiment, the magnetization direction of the second magnetization pinned layers 313C and 413C is set to the X direction.

The magnetization direction change layers 315 and 415 are soft magnetic layers where the magnetization direction is changed according to changes in the signal magnetic fields of the absolute magnetic signal and the incremental magnetic signal in association with the relative movement of the scale part 20. NiFe, CoFe, CoFeB, CoFeNi, $Co_2MnSi$, $Co_2MnGe$, FeOx (oxide of Fe) and the like can be exemplary materials configuring the free layers 315 and 415. The thickness of the magnetization direction change layers 315 and 415 can be adjusted at approximately 0.5 nm to 8 nm. An initial magnetization direction in the magnetization direction change layers 315 and 415 is set to the Y direction due to application of the bias magnetic field from the bias magnetic field generators 32 and 42.

The non-magnetic intermediate layers 314 and 414 are essential films for motivating a magnetoresistive effect (MR effect) in the first MR element 31 and the second MR element 41 in the first embodiment. When the first MR element 31 and the second MR element 41 in the first embodiment are TMR elements that demonstrate a tunnel magnetoresistive effect, the non-magnetic intermediate layers 313 and 414 are made from an insulating layer. In the meantime, when the first MR element 31 and the second MR element 41 in the first embodiment are GMR elements, the non-magnetic intermediate layers are made from a metal layer. For example, Cu, Au, Ag, Zn, Ga, TiOx, ZnO, InO, SnO, GaN, indium tin oxide (ITO), $Al_2O_3$, MgO and the like are exemplary materials configuring the non-magnetic intermediate layers 314 and 414. When the first MR element 31 and the second MR element 41 are TMR elements in the first embodiment, it is preferable to use MgOx (X=0.1 to 0.9) as a material configuring the non-magnetic intermediate layers 314 and 414. A higher MR ratio can be obtained by using MgOx (X=0.1 to 0.9) as a material configuring the non-magnetic intermediate layers 314 and 414.

The nonmagnetic intermediate layers 314 and 414 can be preferably made from, a lamination film with two or more layers. Because the nonmagnetic intermediate layers 314 and 414 are made from a lamination film with two or more layers, the resistance of the MR elements (first MR element 31 and second MR element 41) can be easily adjusted. For example, the nonmagnetic intermediate layers 314 and 414 can be made from a two-layer lamination film, such as MgO/MgO, or a three-layer film, such as Cu/ZnO/Cu or Cu/ZnO/Zn. Furthermore, the thickness of the nonmagnetic intermediate layers 314 and 414 can be approximately 0.5 nm to 5 nm.

The cap layers 316 and 416 are layers for protecting the first MR element 31 and the second MR element 41. As the cap layers 316 and 416, for example, one type of single layer film, or two types or more lamination film out of Ta, Ru, Cu, Ag, Rh, Cr, Tl, Re, Ir, Mo, W, Ti and the like are exemplary materials as the cap layers 316 and 416.

The operation of a magnetic encoder 10 in the first embodiment having the configuration above is explained hereafter. In the first MR element 31, the magnetization 315M and the magnetization 313M of the magnetization direction change layer 315 and the magnetization pinned layer 313 (second magnetization pinned layer 313C) are substantially orthogonal to each other (see FIG. 4). This state is an initial state as the first MR element 31. Similarly in the second MR element 41, the magnetization 415M and the magnetization 413M of the magnetization direction change layer 415 and the magnetization pinned layer 413 (second magnetization pinned layer 413C) are orthogonal to each other (see FIG. 5).

Figure 6:
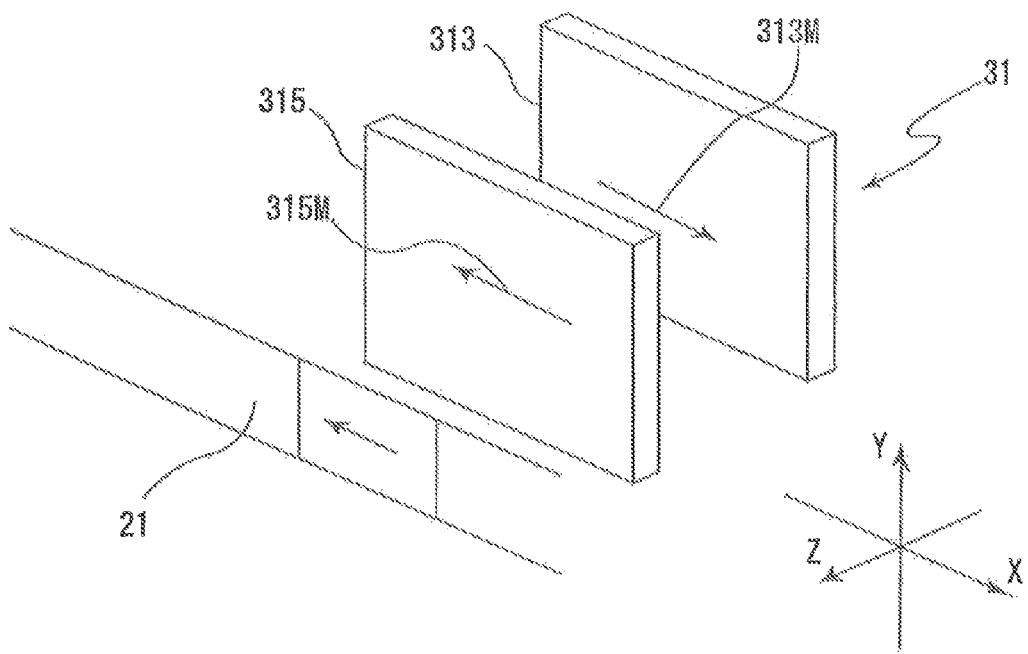
FIG. 6 is a perspective view (No. 2) for explaining operation of the first magnetoresistive effect element in the exemplary embodiment of the present embodiment.
Figure 8:
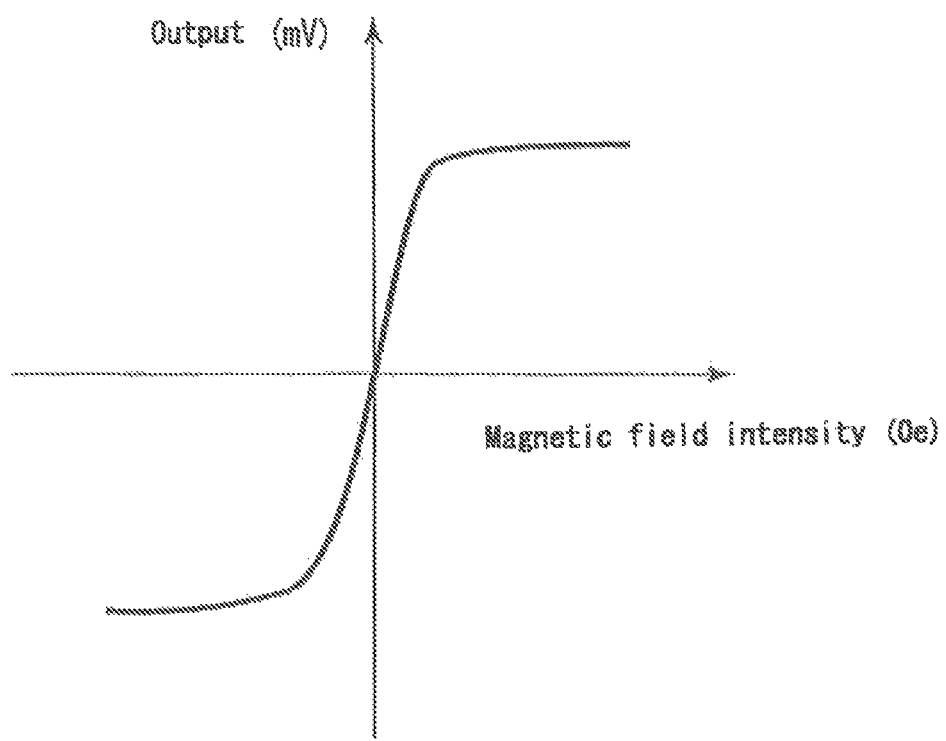
FIG. 8 is a graph showing an output change of the first magnetoresistive effect element in the exemplary embodiment of the present embodiment.

If the magnetic sensor 1 relating to the first embodiment is moved relative to the scale part 20 in the −X direction, the magnetic field intensity of the external magnetic field to the magnetization direction change layer 315 of the first MR element 31 is gradually changed due to an absolute magnetic signal of the absolute signal magnetic track 21. For example, the magnetic sensor 1 and the scale part 20 are moved relative to each other, and as the physical distance between the first MR element 31 and the absolute magnetic signal of the absolute magnetic signal track 21 becomes smaller, the magnetic field intensity of the external magnetic field to the magnetization direction change layer 315 of the first MR element 31 gradually becomes greater. Because the width W1 of the magnetization direction change layer 315 of the first MR element 31 in the first embodiment is greater than the width W2 of the magnetization direction change layer 415 of the second MR element 41 and the sensitivity of the first MR element 31 to the external magnetic field is higher than that of the second MR element 41, to the external magnetic field, when the magnetic field intensity of the external magnetic field to the magnetization direction change layer 315 exceeds a predetermined threshold, the magnetization 315M of the magnetization direction change layer 315 substantially rotates by 90 degrees, and the magnetization 315M of the magnetization direction change layer 315 and the magnetization 313M of the magnetization pinned layer 313 are substantially antiparallel (or parallel) to each other (see FIG. 6). In other words, the resistance value in the first magnetic sensor 3 (first MR element 31) is exponentially increased (or decreased), and the output by the first MR element 31 is exponentially changed (see FIG. 8). This enables the absolute position to be detected with high accuracy.

Figure 7:
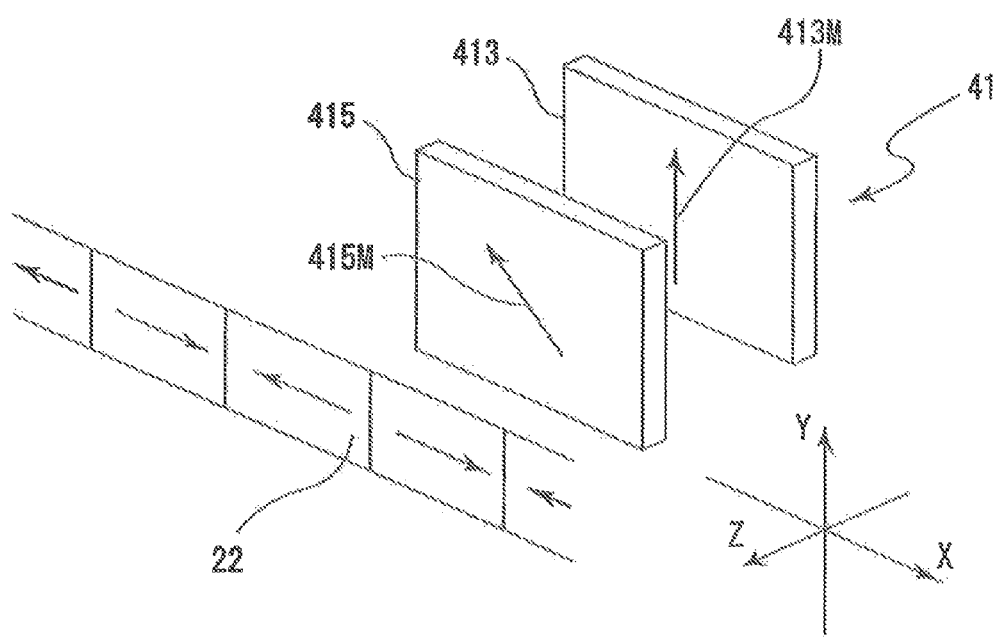
FIG. 7 is a perspective view (No. 2) for explaining operation of the second magnetoresistive effect element in the exemplary embodiment of the present embodiment.
Figure 9:
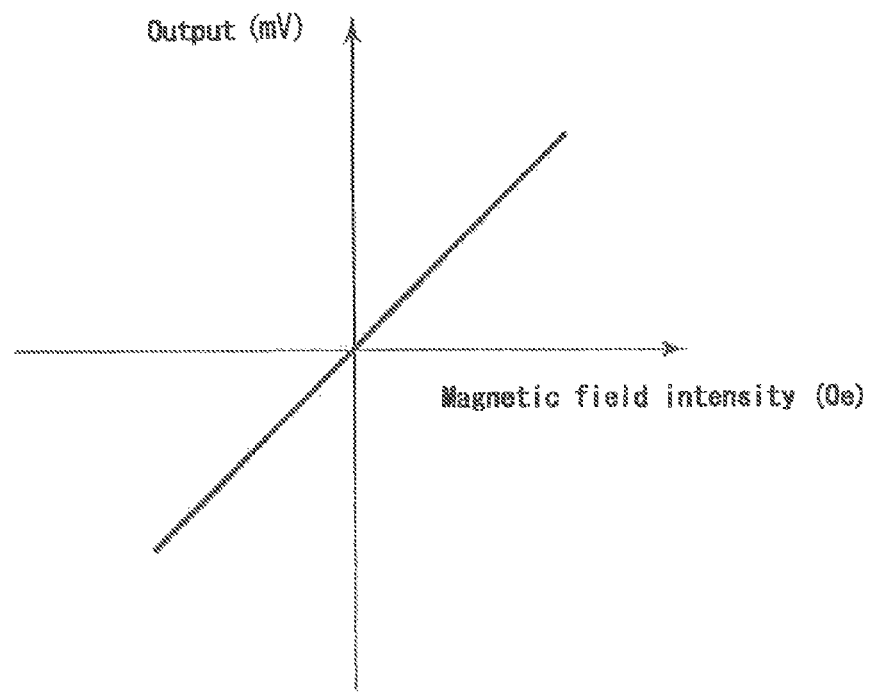
FIG. 9 is a graph showing an output change of the second magnetoresistive effect element in the exemplary embodiment of the present embodiment.

In the meantime, if the magnetic sensor 1 relating to the first embodiment moves relative to the scale part 20 in the −X direction, the magnetic field intensity of the external magnetic field to the magnetization direction change layer 415 of the second MR element 41 due to an incremental magnetic signal of the incremental magnetic signal track 22 is gradually changed. Because the width W2 of the magnetization direction change layer 415 of the second MR element 41 in the first embodiment is smaller than the width W1 of the magnetization direction change layer 315 of the first MR element 31 and the sensitivity of second MR element 41 to the external magnetic field is lower than that of the first MR element 31 to the external magnetic field, the magnetization 415M of the magnetization direction change layer 415 gradually rotates according to changes of the magnetic field intensity of the external magnetic field to the magnetization direction change layer 415 (see FIG. 7). In other words, the resistance value in the second magnetic sensor 4 (second MR element 41) is gradually increased or decreased, and the output by the second MR element 41 is linearly changed (see FIG. 9). This enables incremental positions to be detected with high accuracy.

In the magnetic encoder 10 in the first embodiment, because the width W1 of the magnetization direction change layer 315 of the first MR element 31 is greater than the width W2 of the magnetization direction change layer 415 of the second MR element 41, the output by the first MR element 31 can be exponentially changed; in the meantime, the output by the second MR element 41 can be linearly changed.

Thus, according to the magnetic sensor 1 relating to the first embodiment, because the width W1 of the magnetization direction change layer 315 of the first MR element 31 for detecting an absolute magnetic signal and the width W2 of the magnetization direction change layer 415 of the second MR element 41 for detecting incremental magnetic signals have the desired relationship (W1>W2), the response characteristics (exponential change of output and linear change of output) that are required can be effectively demonstrated. Because of this design, according to the magnetic encoder 10 that is provided with the magnetic sensor 1, the absolute position by the absolute magnetic signal and the incremental position by the incremental magnetic signal can be detected with higher accuracy than a conventional one.

[Second Embodiment]

An explanation is provided of the magnetic sensor relating to the second embodiment. In the magnetic sensor 1 relating to the second embodiment, the width W1 of the first MR element 31 and length L1 in the direction orthogonal to the width W1 (X direction), and the width W2 of the second MR element 41 and length L2 in the direction orthogonal to the width W2 (X direction) have the relationships shown by formulas (3) and (4) below.

$$W1=W2 \tag{3}$$

$$W1/L1 > W2/L2 \tag{4}$$

Furthermore, the magnetic sensor 1 relating to the second embodiment, has a similar configuration to the magnetic sensor 1 relating to the first embodiment above except that the width W1 and the width W2 and the length L1 and the length L2 of the first MR element 31 and the second MR element 41 have the relationships as shown in formulas (3) and (4) above. Consequently, each configuration is marked with the same symbols, and the detailed explanations thereof are omitted.

In the magnetic encoder 10 provided with the magnetic sensor 1 relating to the second embodiment, if the magnetic sensor 1 moves relative to the scale part 20 in the −X direction, the magnetic field intensity of the external magnetic field to the magnetization direction change layer 315 of the first MR element 31 is gradually changed due to the absolute magnetic signal of the absolute magnetic signal track 21. For example, the magnetic sensor 1 and the scale part 20 move relative to each other, and as the physical distance between the first MR element 31 and the absolute magnetic signal of the absolute magnetic signal track 21 becomes smaller, the magnetic field intensity of the external magnetic field to the magnetization direction change layer 315 of the first MR element 31 becomes gradually greater. Because the width W1 of the magnetization direction change layer 315 of the first MR element 31 in the second embodiment and the width W2 of the magnetization direction change layer 415 of the second MR element 41 are the same, and the aspect ratio (W1/L1) of the magnetization direction change layer 315 of the first MR element 31 is greater than the aspect ratio (W2/L2) of the magnetization direction change layer 415 of the second MR element 41, the sensitivity of the first MR element 31 to the external magnetic field is greater than that of the second MR element 41. As a result, when the magnetic field intensity of the external magnetic field to the magnetization direction change layer 315 exceeds a predetermined threshold, the magnetization 315M of the magnetization direction change layer 315 substantially rotates by 90 degrees, and the magnetization 315M of the magnetization direction change layer 315 and the magnetization 313M of the magnetization pinned layer 313 become substantially antiparallel (or parallel) (see FIG. 6). In other words, the resistance value in the first magnetic sensor 3 (first MR element 31) is exponentially increased (or decreased), and the output by the first MR element 31 is exponentially changed (see FIG. 8). This enables absolute positions to be detected with high accuracy.

In the meantime, if the magnetic sensor 1 relating to the second embodiment moves relative to the scale part 20 in the −X direction, the magnetic field intensity of the external magnetic field to the magnetization direction change layer 415 of the second MR element 41 due to an incremental magnetic signal of the incremental magnetic signal track 22 is gradually changed. Because the width W1 of the magnetization direction change layer 315 of the first MR element 31 in the second embodiment and the width W2 of the magnetization direction change layer 415 of the second MR element 41 are the same, and the aspect ratio (W2/L2) of the magnetization direction change layer 415 of the second MR element 41 is smaller than the aspect ratio (W1/L1) of the magnetization direction change layer 315 of the first MR element 31, the sensitivity of the second MR element 41 to the external magnetic field is lower than that of the first MR element 31. As a result, the magnetization 415M of the magnetization direction change layer 415 gradually rotates according to the change of the magnetic field intensity of the external magnetic field to the magnetization direction change layer 415 (see FIG. 7). In other words, the resistance value in the second magnetic sensor 4 (second MR element 41) is gradually increased or decreased, and the output by the second MR element 41 is linearly changed (see FIG. 9). This enables incremental positions to be detected with high accuracy.

Thus, according to the magnetic sensor 1 relating to the second embodiment, because the width W1 and the length L1 of the magnetization direction change layer 315 of the first MR element 31 for detecting an absolute magnetic signal and the width W2 and the length L2 of the magnetization direction change layer 415 of the second MR element 41 for detecting an incremental magnetic signal have the desired relationships (W1=W2, W1/L1>W2/L2), the response characteristics required respectively (exponential change of output, linear change of output) can be effectively demonstrated. Because of this design, according to the magnetic encoder 10 that is provided with the magnetic sensor 1, the absolute position by the absolute magnetic signal and the incremental position by the incremental magnetic signal can be detected with higher accuracy than the conventional one.

The embodiments explained above are described for facilitating the understanding of the present embodiment, and are not described for restricting the present embodiment. Therefore, it is intended that the scope of each element disclosed in the embodiments above includes all design changes and equivalents within to the technical scope of the present embodiment.

In the above embodiments, as the first MR element 31 and the second MR element 41, the TMR element and the GMR element having lamination film structures were explained as examples, but the present embodiment is not limited to such modes, and these may comprise, for example, an AMR element having a monolayer film structure made from a ferromagnetic material.

In the above embodiments, an example where the shape of the first MR element 31 and the shape of the second MR element 41 (shape viewed from the upper side in the lamination direction) are mutually of the same type was explained, but the present embodiment is not limited to such a mode. For example, at least the magnetization direction change layers 315 and 415 can be the same type of shape, and there is no limitation to the shape of the other layers (such as the magnetization pinned layers 313 and 413). In this mode, the width W1, the width W2, the length L1 and the length L2 mean the width W1, the width W2, the length L1 and the length L2 of the magnetization direction change layers 315 and 415, and width and length of other layers (such as the magnetization pinned layer 313 and 413) are not particularly restricted, and can be appropriately set.

Figure 10:
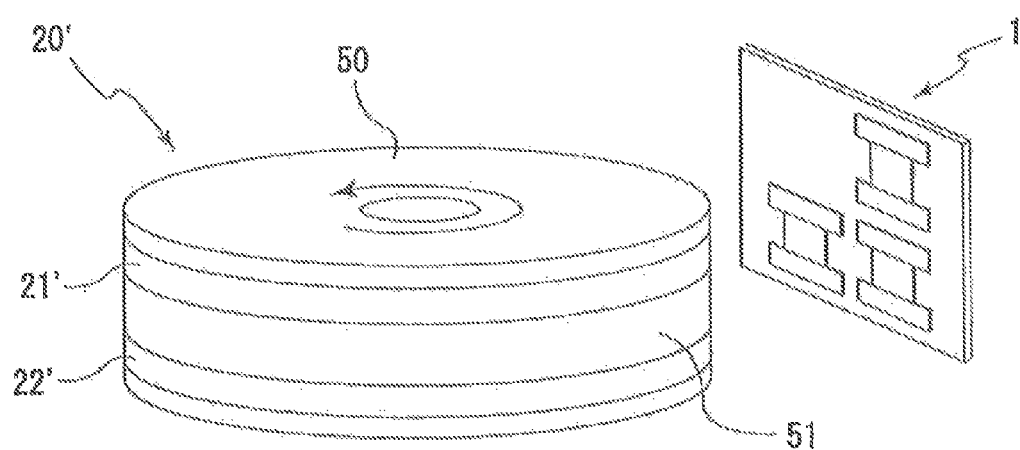
FIG. 10 is a perspective view showing another schematic configuration of the magnetic encoder that is provided with the magnetic sensor relating to the exemplary embodiment of the present embodiment.

In the embodiments above, as an exemplary magnetic encoder 10, a linear sensor having magnetic signal tracks (absolute magnetic signal track 21 and incremental magnetic signal track 22) facing the magnetic sensor 1 was explained, but the present embodiment is not limited to such a mode. The magnetic encoder of the present embodiment may also be a rotation angle sensor. In this case, as shown in FIG. 10, the configuration should be the one that is provided with a scale part 20' where an absolute magnetic signal track 21' and an incremental magnetic signal track 22' are placed on an outer periphery 51 of a drum-state rotating body 50, and the magnetic sensor 1 relating to the embodiments above.

In the embodiments above, the magnetic sensor 1 is provided with the one first MR element 31 and the two second MR elements 41, but the present embodiment is not limited to such a mode, and for example, the first magnetic sensor part 3 may include a plurality of first MR elements 31, and the second magnetic sensor part 4 may include three or more second MR elements 41.

[Embodiment]

The present embodiment is explained in further detail hereafter with reference to the embodiments and the like, but the present embodiment is not limited to the following embodiments.

[Embodiment 1]

The first MR element 31 having the layer configuration shown in FIG. 3 and in Table 1 and a permanent magnet as the bias magnetic field generator 32 were formed on the Si substrate 2. The width W1 of the magnetization direction change layer 315 of the first MR element 31 was set at 2.0 μm and the length L1 was set at 2.0 μm (Sample 1, aspect ratio (W1/L1)=1). The first MR elements 31 where the width W1 and the length L1 of the magnetization direction change layer 315 were changed as shown in Table 2 were similarly produced (Samples 2 to 7).

TABLE 1

|  | Material | Film thickness (Å) |
|---|---|---|
| Cap layer (316) | Ta/Ru | 60/70 |
| Magnetization direction change layer (315) | NiFe | 40 |
| Nonmagnetic intermediate layers (314) | $MgO_X$ (X = 0.8) | 20 |
| Second magnetization pinned layer (313C) | CoFe | 20 |
| Intermediate layer (313B) | Ru | 8 |
| First magnetization pinned layer (313A) | CoFe | 20 |
| Antiferromagnetic layer (312) | IrMn | 100 |
| Under layer (311) | Ta/Ru | 20/20 |

Then, while a constant current with 1 V of voltage was applied to the first MR element 31 in Samples 1 to 4, respectively, the external magnetic field intensity varied within the range of −10 to 10 Oe, and the external magnetic field was applied to the first MR element 31, and sensitivity (mV/mT) of the first MR element 31 was obtained. The results are shown in Table 2.

Subsequently, the external magnetic field intensity varied within the range of −50 to 50 Oe using the first MR element of Samples 1 to 7, and the output change volume (difference between maximum output and minimum output, mV) of the first MR element was obtained, respectively. Then, an index IL regarding linearity was calculated with the formula below, from the output change volume MP1 (mV) of the first MR element when the external magnetic field intensity varied within the range of −10 to 10 Oe and the output change volume MP2 (mV) of the first MR element when the external magnetic field intensity varied within the range of −50 to 50 Oe. The results are shown in Table 2.

$$IL = MP2/MP1$$

TABLE 2

|  | Width W1 (μm) | Length L1 (μm) | Aspect ratio (W1/L1) | Sensitivity (mV/mT) | Linearity |
|---|---|---|---|---|---|
| Sample 1 | 2.0 | 2.0 | 1.00 | 2.5 | 4.0 |
| Sample 2 | 2.0 | 2.5 | 0.80 | 2.4 | 4.1 |
| Sample 3 | 2.0 | 3.0 | 0.67 | 2.2 | 4.3 |
| Sample 4 | 2.0 | 4.0 | 0.50 | 2.1 | 4.5 |
| Sample 5 | 2.0 | 1.6 | 1.25 | 2.1 | 4.1 |
| Sample 6 | 1.0 | 2.0 | 0.50 | 2.0 | 4.5 |
| Sample 7 | 1.0 | 3.0 | 0.33 | 1.8 | 4.7 |
| Sample 8 | 1.0 | 4.0 | 0.25 | 1.5 | 5.0 |
| Sample 9 | 4.0 | 4.0 | 1.00 | 2.8 | 4.0 |

As shown in Table 2, it was confirmed that the greater the width W1 in the Y direction, the higher the sensitivity, i.e., the output could be exponentially changed. Further, even though the width W1 in the Y direction is the same, it was confirmed that the greater the aspect ratio (W1/L1), the higher the sensitivity, and the output could be exponentially changed.

According to the above results, because the width W1 of the first MR element 31 and the width W2 of the second MR element 41 have the relationship expressed in the formula (1) below, it was confirmed that the output of the first MR element 31 could be exponentially changed, and the output of the second MR element 41 could be linearly changed. In this case, because the aspect ratio (W1/L1) of the first MR element 31 and the aspect ratio (W2/L2) of the second MR element 41 have the relationship expressed by the formula (2) below, it was confirmed that the output of the first MR element 31 could be more exponentially changed, and the output of the second MR element 41 could be more linearly changed.

$$W1 > W2 \quad (1)$$

$$W1/L1 \geq W2/L2 \quad (2)$$

Further, according to the above results, because the width W1 of the first MR element 31 and the width W2 of the second MR element 41, and, the aspect ratio (W1/L1) of the first MR element 31 and the aspect ratio (W2/L2) of the second MR element 41 have the relationships expressed by the formulas (3) and (4) below, it was confirmed that the output of the first MR element 31 could be exponentially changed, and the output of the second MR element 41 could be linearly changed.

$$W1 = W2 \quad (3)$$

$$W1/L1 > W2/L2 \quad (4)$$

What is claimed is:

1. A magnetic encoder, comprising:
a magnetic sensor, and
a scale part that has an absolute signal track where absolute magnetic signals are recorded and an incremental signal track where incremental magnetic signals are recorded, wherein
the magnetic sensor and the scale part are placed to face each other to allow the first magnetoresistive effect element and the absolute signal track to face each other and to allow the second magnetoresistive effect element and the incremental signal track to face each other
the scale part is movable relative to the magnetic sensor,
the magnetic sensor comprises at least a first magnetoresistive effect element and a second magnetoresistive effect element that can detect an external magnetic field,
the first magnetoresistive effect element and the second magnetoresistive effect element each include at least a magnetization direction change layer where a direction of magnetization is changed according to the external magnetic field, respectively,
width W1 of the magnetization direction change layer in an initial magnetization direction of magnetization direction change layer of the first magnetoresistive effect element and width W2 of the magnetization direction change layer in an initial magnetization direction of magnetization direction change layer of the second magnetoresistive effect element have a relationship shown by formula (1) below,
sensitivity of the first magnetoresistive effect element to the external magnetic field is higher than that of the second magnetoresistive effect element to the external magnetic field, and
the magnetic sensor and the scale part are placed to face each other to allow the first magnetoresistive effect element and the absolute signal track to face each other and to allow the second magnetoresistive effect element and the incremental signal track to face each other, and $$W1 > W2 \quad (1).$$

2. The magnetic encoder according to claim 1, wherein an initial magnetization direction of the magnetization direction change layer in the first magnetoresistive effect element and the second magnetoresistive effect element, respectively, is a direction that is orthogonal to a relative movement direction of the scale part.

3. The magnetic encoder according to claim 1, wherein a ratio W1/L1 of the width W1 of the magnetization direction change layer of the first magnetoresistive effect element to length L1 in a direction that is orthogonal to the width W1 and a ratio W2/L2 of the width W2 of the magnetization direction change layer of the second magnetoresistive effect element to length L2 in a direction that is orthogonal to the width W2 are both 1.2 or less.

4. The magnetic encoder according to claim 1, wherein a ratio W1/L1 of the width W1 of the magnetization direction change layer of the first magnetoresistive effect element to length L1 in a direction that is orthogonal to the width W1 and a ratio W2/L2 of the width W2 of the magnetization direction change layer of the second magnetoresistive effect element to length L2 in a direction that is orthogonal to the width W2 have a relationship shown in the following formula (2):

$$W1/L1 > W2/L2 \qquad (2).$$

5. The magnetic encoder according to claim 1, wherein a ratio of the width W1 of the magnetization direction change layer of the first magnetoresistive effect element to the width W2 of the magnetization direction change layer of the second magnetoresistive effect element is 1:0.2 to 0.9.

6. The magnetic encoder according to claim 1, wherein a ratio of the width W1 of the magnetization direction change layer in an initial magnetization direction of the magnetization direction change layer of the first magnetoresistive effect element to the length L1 in a direction that is orthogonal to the width W1 is 0.8 or greater.

7. The magnetic encoder according to claim 1, wherein when the first magnetoresistive effect element and the second magnetoresistive effect element are viewed from an upper side in the lamination direction, a shape of the magnetization direction change layer of the first magnetoresistive effect element and a shape of the magnetization direction change layer of the second magnetoresistive effect element are the same.

8. The magnetic encoder according to claim 1, wherein the first magnetoresistive effect element and the second magnetoresistive effect element comprise one of a TMR element, a GMR element and an AMR element.

9. The magnetic encoder according to claim 8, wherein the nonmagnetic intermediate layer is MgOx (X=0.1 to 0.9).

10. The magnetic encoder according to claim 1, wherein the first magnetoresistive effect element and the second magnetoresistive effect element are formed by laminating a magnetization pinned layer, a nonmagnetic intermediate layer, and the magnetization direction change layer in that order.

11. A magnetic encoder, comprising:
a magnetic sensor, and
a scale part that has an absolute signal track where absolute magnetic signals are recorded and an incremental signal track where incremental magnetic signals are recorded, wherein
the scale part is movable relative to the magnetic sensor,
the magnetic sensor comprises at least a first magnetoresistive effect element and a second magnetoresistive effect element that can detect an external magnetic field,
the first magnetoresistive effect element and the second magnetoresistive effect element each include at least a magnetization direction change layer where a direction of magnetization is changed according to the external magnetic field, respectively,
width W1 of the magnetization direction change layer in an initial magnetization direction of magnetization direction change layer of the first magnetoresistive effect element, length L1 in a direction that is orthogonal to the width W1, width W2 of the magnetization direction change layer in an initial magnetization direction of magnetization direction change layer of the second magnetoresistive effect element, and length L2 in a direction that is orthogonal to the width W2 have relationships shown by formulas (3) and (4) below,
sensitivity of the first magnetoresistive effect element to the external magnetic field is higher than that of the second magnetoresistive effect element to the external magnetic field,
the magnetic sensor and the scale part are placed to face each other to allow the first magnetoresistive effect element and the absolute signal track to face each other and to allow the second magnetoresistive effect element and the incremental signal track to face each other, $$W1 = W2 \qquad (3); \text{ and}$$

$$W1/L1 > W2/L2 \qquad (4).$$

12. The magnetic encoder according to claim 11, wherein an initial magnetization direction of the magnetization direction change layer in the first magnetoresistive effect element and the second magnetoresistive effect element, respectively, is a direction that is orthogonal to a relative movement direction of the scale part.

* * * * *